United States Patent
Wang

(10) Patent No.: US 11,692,094 B2
(45) Date of Patent: Jul. 4, 2023

(54) HIGH TEMPERATURE POLYKETONE COPOLYMERS

(71) Applicant: HT Materials Corporation, Clifton Park, NY (US)

(72) Inventor: YiFeng Wang, Clifton Park, NY (US)

(73) Assignee: HT MATERIALS CORPORATION, Clifton Park, NY (US)

( * ) Notice: Subject to any disclaimer, the term of this patent is extended or adjusted under 35 U.S.C. 154(b) by 309 days.

(21) Appl. No.: 17/198,143

(22) Filed: Mar. 10, 2021

(65) Prior Publication Data

US 2022/0081549 A1 Mar. 17, 2022

Related U.S. Application Data

(60) Provisional application No. 63/079,587, filed on Sep. 17, 2020.

(51) Int. Cl.
*C08L 39/04* (2006.01)
*C08K 7/14* (2006.01)
(Continued)

(52) U.S. Cl.
CPC ............... *C08L 39/04* (2013.01); *B32B 5/06* (2013.01); *B32B 27/08* (2013.01); *B32B 27/20* (2013.01);
(Continued)

(58) Field of Classification Search
CPC .......... C08L 79/04; C08L 75/02; C08L 39/04; C08G 73/0677; C08G 71/02; B32B 27/28;
(Continued)

(56) References Cited

U.S. PATENT DOCUMENTS 4,774,311 A 9/1988 Kelsey
8,609,801 B2 * 12/2013 Hay .................... C08G 65/4037
528/226

(Continued)

FOREIGN PATENT DOCUMENTS

CN 1353125 A 12/2002
CN 103450478 A 12/2013
CN 103509185 A 1/2014

OTHER PUBLICATIONS

Feng, J, et al., "Preparation and characterization of poly (ether ether ketone)s", J. Polym Res (2016) 23: 247. (Year: 2016).*

*Primary Examiner* — Kregg T Brooks
*Assistant Examiner* — David R. Foss
(74) *Attorney, Agent, or Firm* — Cantor Colburn LLP

(57) ABSTRACT

Compositions and methods for amorphous high temperature polyketone polymers incorporating 2H-benzimidazol-2-one with dihalobenzophenone and bis(halobenzoyl)benzene as comonomer units are described herein. The polyketones polymers have advantageous properties, particularly in terms of high glass transition temperatures ($T_g$), inherently flame resistance, good mechanical properties at elevated temperature, chemical resistance and dimensional stability in wet environment. The polymers are suitable for manufacturing high temperature molded systems and other articles of manufacture via injection molding, extrusion, compression molding, coating, blow molding, thermoforming, rotational molding and additive manufacturing.

20 Claims, 4 Drawing Sheets

(51) Int. Cl.
    *C08J 5/10*     (2006.01)
    *C08F 226/06*     (2006.01)
    *B32B 27/08*     (2006.01)
    *B32B 27/20*     (2006.01)
    *B32B 5/06*     (2006.01)
    *C08G 73/06*     (2006.01)
    *C08L 79/04*     (2006.01)
    *C08G 71/02*     (2006.01)
    *B32B 27/28*     (2006.01)

(52) U.S. Cl.
    CPC .......... *B32B 27/288* (2013.01); *C08F 226/06* (2013.01); *C08G 71/02* (2013.01); *C08G 73/0677* (2013.01); *C08J 5/10* (2013.01); *C08K 7/14* (2013.01); *C08L 79/04* (2013.01); *B32B 2262/0238* (2013.01); *B32B 2262/101* (2013.01); *B32B 2262/106* (2013.01); *B32B 2307/202* (2013.01); *B32B 2457/08* (2013.01)

(58) Field of Classification Search
    CPC ....... B32B 27/08; B32B 27/20; B32B 27/288; B32B 2262/0238; B32B 2262/101; B32B 2262/106; B32B 2307/202; B32B 2457/08; B32B 5/06; C08J 5/04; C08K 7/14; C08F 226/06
    See application file for complete search history.

(56) References Cited

U.S. PATENT DOCUMENTS

| | | |
|---|---|---|
| 2006/0094852 A1 | 5/2006 | Yuan et al. |
| 2007/0197739 A1 | 8/2007 | Aneja et al. |
| 2009/0082538 A1 | 3/2009 | Wu |
| 2011/0218315 A1 | 9/2011 | Wu et al. |
| 2012/0095182 A1 | 4/2012 | Wu et al. |
| 2021/0380762 A1 | 12/2021 | Wang |

\* cited by examiner

HIGH TEMPERATURE POLYKETONE COPOLYMERS

CROSS-REFERENCE TO RELATED APPLICATIONS

The present application claims priority from U.S. Provisional Patent Application Ser. No. 63/079,587, filed on Sep. 17, 2020 which is incorporated by reference in its entirety as if fully set forth.

STATEMENT REGARDING FEDERALLY SPONSORED RESEARCH OR DEVELOPMENT

No Applicable

THE NAMES OF THE PARTIES TO A JOINT RESEARCH AGREEMENT

No Applicable

REFERENCE TO A "SEQUENCE LISTING," A TABLE, OR A COMPUTER PROGRAM

Not Applicable

STATEMENT REGARDING PRIOR DISCLOSURES BY THE INVENTOR OR A JOINT INVENTOR

Not Applicable

FIELD OF THE INVENTION

The present invention generally relates to amorphous polyketone copolymer compositions with improved heat resistance and chemical resistance, to a method of making the same, and to the use thereof in challenging environments.

BACKGROUND OF THE INVENTION

High performance polymers such as polyimide, polyamideimide, polyetherimide, polysulfones and poly(aryl ether ketone)s have high strength, heat resistance, modulus, low weight, electrical insulation, flame resistance, and broad chemical resistance, and so are widely used in applications as diverse as automotive, oil and gas, telecommunication, electrical/electronics, transportation, and healthcare.

Poly(aryl ether ketone) (PAEK) polymers, such as poly (ether ether ketone) (PEEK) polymers, are known for their high temperature performance, excellent chemical resistance, inherent flame resistance, low smoke toxicity, high strength and light weight. PAEK has been widely used in various demanding applications in oil and gas production, components for aircraft and automotive, and medical devices. PEEK material is widely used as seals and backup rings for sealing applications as diverse as valves, pipelines, compressors, packers, manifolds and blowout preventers in oil and gas production. It is also used for electrical connectors, electrical insulation, fluid transport tubing, and compressor components. Due to its relatively low glass transition temperature of about 145° C., PEEK is somewhat limiting its ability to withstand continuous operations at temperatures of 150° C. or beyond.

Other PAEK polymers have been proposed with increased glass transition temperatures, such as polyetherketone (PEK) (Victrex™ PEEK-HT), poly(ether ketone ketone) (Arkema Kepstan™ PEKK), and poly(ether ketone ether ketone ketone) (PEKEKK) (Victrex™ PEEK-ST). All these PAEKs, while possessing increased glass transition temperatures, their glass transition temperatures are between 150 to 165° C. and are somewhat limiting their ability to withstand continuous operations at temperatures of 170° C. or beyond. These PAEKs are also known as more sensitive to chemicals in aggressive environments, e.g., they possess lower steam resistance, and may suffer from excessively high melting temperatures, associated hence to processing hurdles.

In U.S. Pat. No. 8,609,801, Hay et al teach a new class of polymers and copolymers containing 2H-benzimidazol-2-one moieties. In particular, Hay et al disclose a polyketone copolymer of 2H-benzimidazol-2-one and 2,2-bis(4-hydroxyphenyl)propane with 4,4'-difluorobenzophenone:

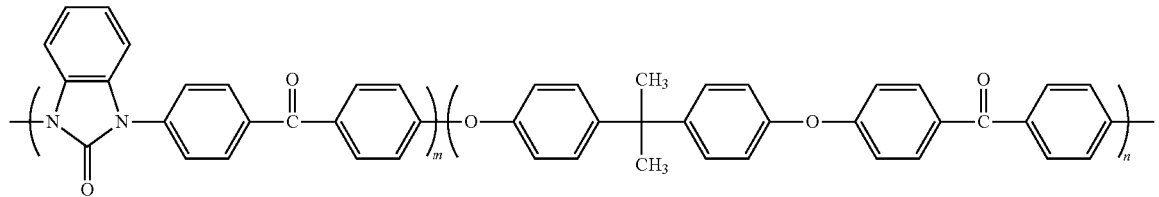

wherein the molar ratios of m:n is from 30:70 to 50:50 and the glass transition temperature is from 170° C. to 200° C.; and a polyketone copolymer of 2H-benzimidazol-2-one and hydroquinone with 4,4'-difluorobenzophenone:

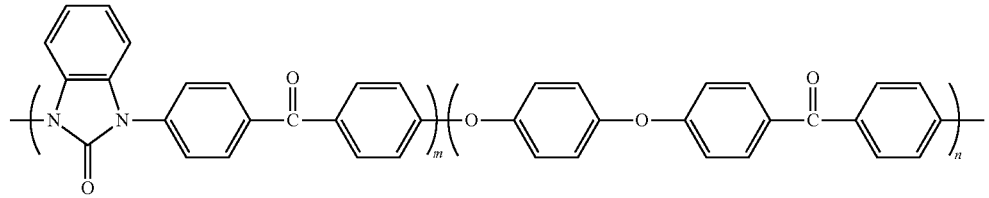

wherein the molar ratios of m:n is from 12.5:87.5 to 30:70 and the glass transition temperature is from 163° C. to 186° C.;
and a polyketones copolymer of 2H-benzimidazol-2-one and 4,4'-biphenol with 4,4'-difluorobenzophenone:

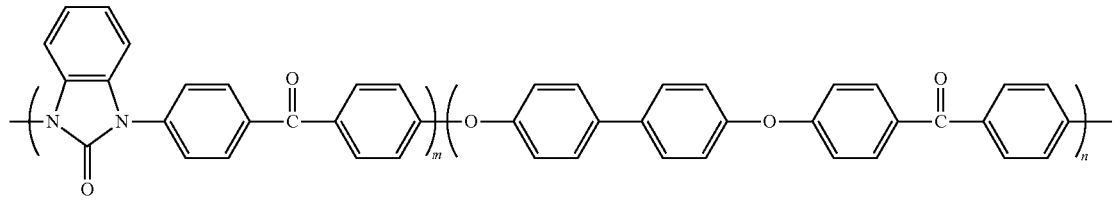

wherein the molar ratios of m:n is from 30:70 to 70:30 and the glass transition temperature is from 217° C. to 235° C.

Chinese Patent CN103450478B teaches a polyketone homopolymer of 2H-benzimidazol-2-one and 4,4'-difluorobenzophenone with glass transition temperature of 226° C.

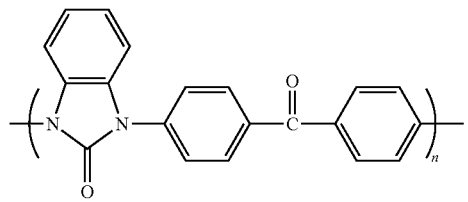

Due to the relatively low glass transition temperatures, these polyketone polymers from 2H-benzimidazol-2-one will have limited application in service temperature above 240° C.

Polyetherimide such as SABIC Ultem® resin and polysulfones such as BASF Ultrason® resins have glass transition temperatures $T_g$ of less than 230° C. and their thermal resistance is typically limited to less than 210° C.

Polyimide such as Misui Aurum® thermoplastic polyimide resin and polyamideimide such as Solvay Torlon® resin have glass transition temperatures $T_g$ of greater than 250° C., and withstand continuous operation at temperatures up to 260° C. However, both polyimide and polyamideimide can absorb significant amount of moisture in a wet environment, and consequently have poor dimensional stability and hydrolytical stability due to moisture up-taking.

Although polyamideimide Torlon® resin can be melt processed via extrusion, injection molding and compression molding, to achieve desirable mechanical properties and thermal properties, the molded shapes and parts are required to undertake tedious curing processes at elevated temperatures for extended period time, typically from 10 to 20 days at temperatures up to 260° C. This post-molding process adds significant processing complexity and manufacturing cost and limits its usages in a wide range of applications.

The miniaturization and increased durability of electronics devices increasingly demands higher performance material. These devices require injection molded polymer components, since that fabrication process is well suited for manufacturing at high volumes and low cost. The molded components are required to retain their shape at temperatures in excess of 240° C., since these components are exposed to high temperatures during their placement on printed circuit boards by a solder re-flow process or a solder bath, especially lead-free solder processes. For this reason, only polymers with high glass transition temperatures can be used.

Hence there is a continuing need for polymers having good performance properties at temperatures in excess of 240° C. and ease of processing which combine the high temperature characteristics of polyamideimide and chemical and moisture resistance of polyaryletherketone but still have sufficient melt processability to be easily formed into shapes and components, without lengthy post-molding treatment, via conventional molding techniques such as injection molding, gas assist molding, extrusion, thermoforming, blow molding, compression molding, rotational molding and coating.

BRIEF SUMMARY OF THE INVENTION

The present invention provides amorphous polyketone copolymer that incorporate 2H-benzimidazol-2-one and 4,4'-dihalobenzophenone with bis(4-halobenzoyl)benzene as comonomer units. The bis(4-halobenzoyl)benzene can be selected from 1,4-bis(4-halobenzoyl)benzene, 1,3-bis(4-halobenzoyl)benzene, or a combination of 1,4-bis(4-halobenzoyl)benzene and 1,3-bis(4-halobenzoyl)benzene.

The amorphous polyketone copolymers containing 2H-benzimidazol-2-one with 4,4'-dihalobenzophenone and bis(4-halobenzoyl)benzene comonomer units according to the current invention have advantageous properties, particularly in terms of their high glass transition temperatures ($T_g$) from 270° C. to 300° C. The high glass transition temperatures of these copolymers are unexpectedly achieved with addition of small amount (e.g., 7 mol %) of 1,4-bis(4-halobenzoyl)benzene as comonomer using a hydrophilic organic solvent N-Cyclohexyl-2-pyrrolidone (CHP) as polymerization solvent, considering that the homopolymer of 2H-benzimidazol-2-one and 4,4'-difluorobenzophenone has a $T_g$ of only 226° C. as reported in Chinese Patent CN103450478B. The said amorphous polyketone copolymers are suitable for manufacturing high temperature molded systems and other articles of manufacture via injection molding, extrusion, compression molding, blow molding, thermoforming, rotational molding, coating and additive manufacturing.

The present invention also provides amorphous polyketone copolymers that incorporate 2H-benzimidazol-2-one with a mixture of 1,4-bis(4-halobenzoyl)benzene and 1,3-bis(4-halobenzoyl)benzene.

Another embodiment of this invention produces polyketone copolymers of these instant chemical structures that exhibit high glass transition temperature under the conditions subsequently defined herein.

DESCRIPTION AND DEFINITION OF TERMS

Definition of Terms

Figure 1:
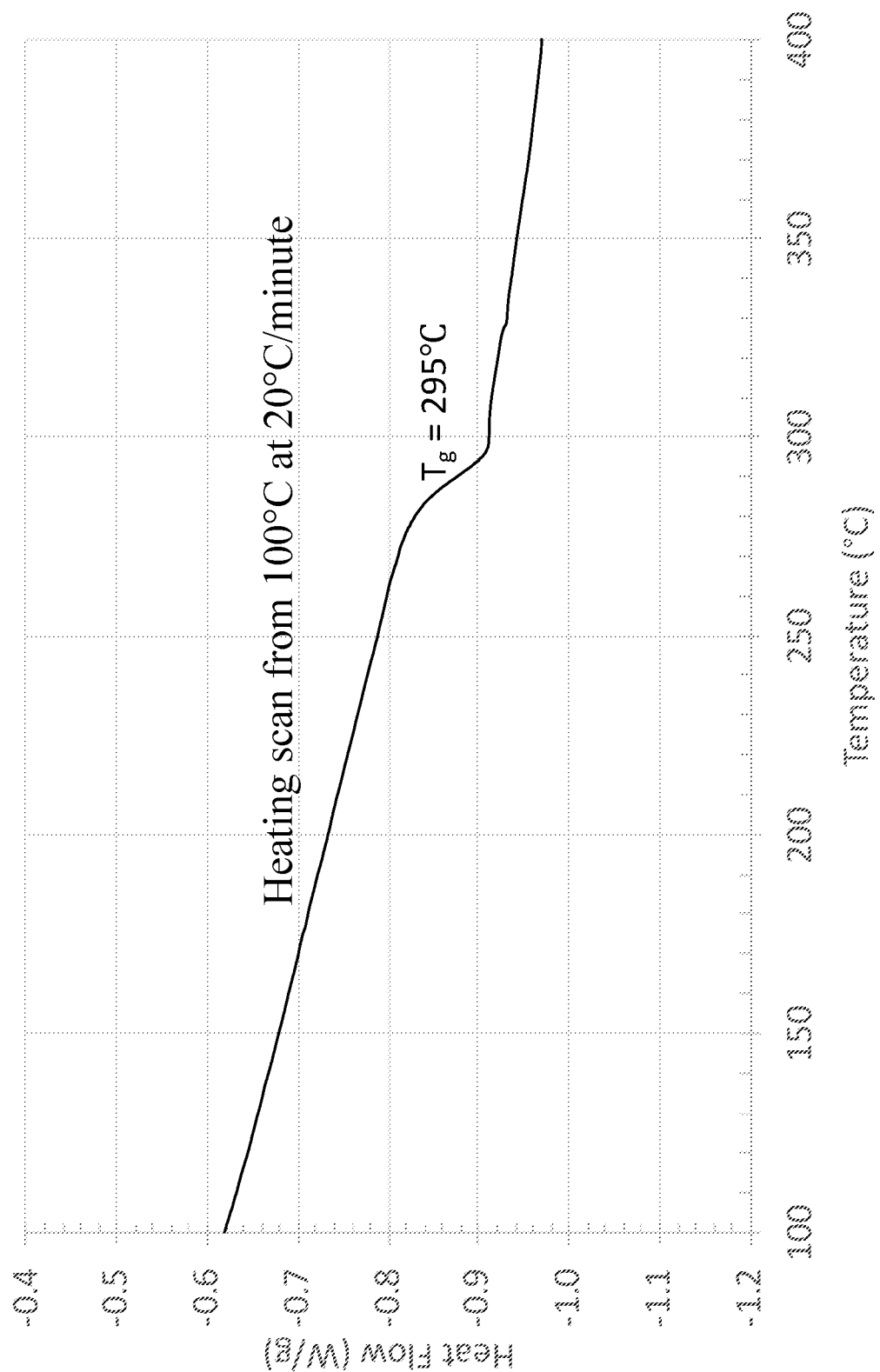
FIG. 1 is a graphical plot of DSC heating scan curve at 20° C./minute for the polyketone copolymer of Example 4.

As referred to in this application, the following definition and terms are used:

"DSC" means Differential Scanning calorimetry (DSC) which is an analytical technique used to investigate the response of polymers to heating. DSC is used to study the glass transition, melting and crystallization of polymers.

"Copolymer" means polymer made from three or more monomers via polycondensation reaction, preferably made from a bisphenol or bisphenol equivalent compound with dihalo aromatic ketone compounds. 2-Benzimidazolinone is selected as the bisphenol equivalent compound, and the dihalo aromatic ketone compounds are selected from mixtures of 4,4'-dihalobenzophone and 1,4-bis(4-halobenzoyl)benzene, mixtures of 4,4'-dihalobenzophenone and 1,3-bis(4-halobenzoyl)benzene, mixtures of 4,4'-dihalobenzophenone, 1,4-bis(4-halobenzoyl)benzene and 1,3-bis(4-halobenzoyl)benzene, and mixtures of 1,4-bis(4-halobenzoyl)benzene and 1,3-bis(4-halobenzoyl)benzene.

"$T_g$" means glass transition temperature from second DSC heating scan at 20° C./minute after cooling from melt.

"Amorphous" means a polymer with no detectable crystallization temperature $T_c$ from first DSC cooling scan at 20° C./minute from melt and no detectable melting temperature $T_m$ from second DSC heating scan.

"IV" means inherent viscosity measured at 0.5 wt/vol % in 96% $H_2SO_4$ at 30° C. expressed in dL/g using a Cannon-Fenske capillary, size 200.

"Fluoropolymer" means any polymer having at least one, if not more, fluorine atom contained within the repeating unit of the polymer structure.

The terms 2H-benzimidazol-2-one and 2H-benzimidazolone are used interchangeably herein.

The words repeating and recurring are used interchangeably herein.

DESCRIPTION OF THE INVENTION

A preferred embodiment of the present invention addresses the above problems described in the Background of the Invention.

A second embodiment of the present invention provides a polyketone polymeric material which has high $T_g$ (higher than 240° C.).

A third embodiment of the present invention provides a polyketone polymeric material that is melt processable and has a $T_g$ less than 310° C.

The preferred embodiments of the invention are useful in providing advantageous polyketone materials for use in high temperature and challenging environments.

In one aspect of the invention, there is provided a polyketone copolymer having at least two recurring units selected from the group of recurring units consisting of a first recurring unit of formula, formula I

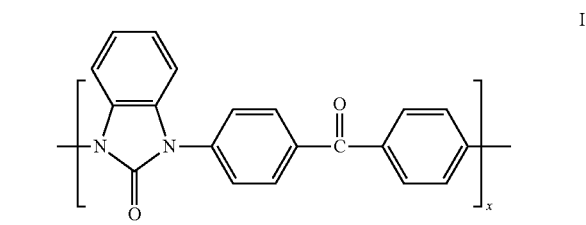

I and a second recurring unit of formula, formula II

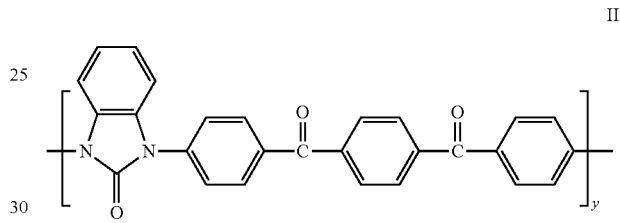

II and a third recurring unit of formula, formula III

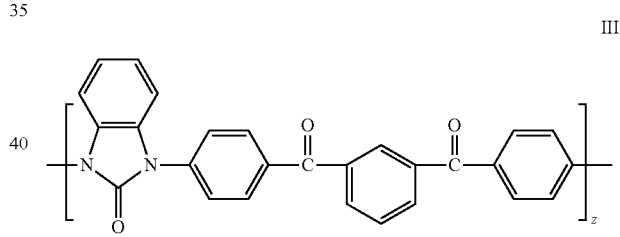

III wherein the value of the subscript x ranges from 0 to 5000, the value of the subscript y ranges from 0 to 5000, the value of the subscript z ranges from 0 to 5000, subject to the limitation that the ratio of x:(y+z) ranges from 99:1 to 0:100; the ratio of y:z ranges from 100:0 to 0:100 when x is greater than 0, and the ratio of y:z ranges from 99:1 to 1:99 when x is 0.

In another aspect of the invention, there is provided a polyketone copolymer having a repeating unit of formula I and a repeating unit of formula II, wherein the value of the subscript x ranges from 1 to 5000, subject to the limitation that the value of the subscript y ranges from 1 to 5000, and the ratio of x:y ranges from 1:99 to 99:1.

In another aspect of the invention, there is provided a polyketone copolymer having a repeating unit of formula I and a repeating unit of formula III, wherein the subscript x ranges from 1 to 5000, subject to the limitation that the value of the subscript z ranges from 1 to 5000, and the ratio of x:z ranges from 1:99 to 1:99.

In still another aspect of the invention, there is provided a polyketone copolymer having a repeating unit of formula II and a repeating unit of formula III, wherein the subscript y ranges from 1 to 5000, subject to the limitation that the value of the subscript z ranges from 1 to 5000, and the ratio of y:z ranges from 1:99 to 99:1.

In still another aspect of the invention, there is provided a polyketone polymer having a $T_g$ of about 245° C. to about 305° C.

DSC may be used to examine a 10±2 mg sample of polyketone copolymer in a TA Instruments DSC Q2000 under nitrogen at a flow rate of 40 ml/min. The scan procedure may be:
Step 1: Perform a preliminary thermal cycle by heating the sample from 50° C. to 430° C. at 20° C./minute
Step 2: Hold at 430° C. for 3 minutes
Step 3: Cool to 50° C. at 20° C./minute
Step 4: Heat from 50° C. to 430° C. at 20° C./minute, record $T_g$ From the resulting second heating scan the onset of the $T_g$ may be obtained as the intersection of lines drawn along the pretransition baseline and a line drawn along the greatest slope obtained during the transition.

The Tg of said polyketone copolymer may be greater than 245° C. and is less than 310° C., preferably greater than 260° C. and less than 305° C., most preferably greater than 270° C. and less than 300° C. The $T_g$ is preferably in the range of 270° C. to 300° C.

Said polyketone copolymer suitably has an inherent viscosity (IV) of about 0.1 to about 5.0 dL/g, preferably greater than 0.3 dL/g and less than 3.0 dL/g. The IV is preferably in the range of 0.5 to 1.5 dL/g. The IV is further preferably in the range of 0.5 to 1.0 dL/g. The inherent viscosity of polyketone copolymer is suitably measured pursuant to ASTM D2857 standard at 30° C. on 0.5 wt/vol % solution in concentrated $H_2SO_4$ (96 wt %) and expressed in dL/g using a Cannon-Fenske capillary, size 200.

In one aspect, said polyketone copolymer, comprising of repeating units of formula I, repeating units of formula II and repeating units of formula III, may include at no more than 99 mol %, preferably no more than 90 mol %, of repeating units of formula I. Said polyketone copolymer may include 1 to 99 mol %, preferably 10 to 90 mol %, more preferably 20 to 85 mol % of repeating units of formula I. The said polyketone copolymer may include at least 1 mol %, preferably at least 10 mol %, more preferably at least 15 mol %, especially at least 25 mol %, of repeating units of formula II, said polyketone copolymer may include 1 to 99 mol %, preferably 10 to 90 mol %, more preferably 15 to 85 mol % of repeating units of formula II. Subject to the limitation, the said polyketone polymer may also include at no more than 99 mol %, preferably no more than 90 mol %, of repeating units of formula III. Subject to the limitation, the said polyketone polymer may include 1 to 99 mol %, preferably 10 to 90 mol %, more preferably 15 to 80 mol % of repeating units of formula III.

In another aspect, said polyketone copolymer, comprising of repeating units of formula I and repeating units of formula II, may include at least 1 mol %, preferably at least 10 mol %, more preferably at least 15 mol %, especially at least 25 mol % of repeating units of formula II. The said polyketone copolymer may include 1 to 99 mol %, preferably 10 to 90 mol %, more preferably 15 to 85 mol % of repeating units of formula II; and the said polyketone copolymer may include at no more than 99 mol %, preferably no more than 90 mol %, of repeating units of formula I. Said polyketone copolymer may include 1 to 99 mol %, preferably 10 to 90 mol %, more preferably 15 to 85 mol % of repeating units of formula I.

In still another aspect, said polyketone copolymer, comprising of repeating units of formula I and repeating units of formula III, may include at least 1 mol %, preferably at least 10 mol %, more preferably at least 15 mol %, especially at least 25 mol % of repeating units of formula III. Said polyketone copolymer may include 1 to 99 mol %, preferably 10 to 90 mol %, more preferably 15 to 85 mol % repeating units of formula III; and the said polyketone copolymer may include at no more than 99 mol %, preferably no more than 90 mol %, of repeating units of formula I. The said polyketone copolymer may include 1 to 99 mol %, preferably 10 to 90 mol %, more preferably 15 to 85 mol % of repeating units of formula I.

In still another aspect, said polyketone copolymer, comprising of repeating units of formula II and repeating units of formula III, may include 1 to 99 mol % of repeating unit of formula II, and 99 to 1 mol % of repeating unit of formula III.

Said polyketone copolymer may be in monofilament form with a diameter in a range of 0.1 mm to 5.0 mm. The monofilament of the said polyketone copolymer can be used in filament fusion fabrication 3D printing or other rapid prototyping method.

Said polyketone copolymer may be in powder form with particle size (D90) less than 200 μm. The powder of the said polyketone copolymer can be used in SLS 3D printing or other rapid prototyping method, in compression molding or in electrostatic or solvent-borne powder coating.

Said polyketone copolymer can be blended with one or more other polymers which include but not limited to polybenzimidazole, polyarylamides, polysulfones, polyketones, polyimides, polyamideimide, polyetherimides, polyphenylenesulfides, fluoropolymers, polyamides, polyesters and polycarbonates.

Said polyketone copolymer may be part of a composition which may include said polyketone copolymer and a filler. Said filler may include a fibrous filler or a non-fibrous filler. Said filler may include both a fibrous filler and a non-fibrous filler.

A said fibrous filler may be continuous or discontinuous.

A said fibrous filler may be selected from inorganic fibrous materials, non-melting and high-melting organic fibrous materials, such as aramid fiber, and carbon fiber.

A said fibrous filler may be selected from glass fiber, carbon fiber, silica fiber, alumina fiber, zirconia fiber, boron nitride fiber, silicon nitride fiber, boron fiber, fluoropolymer fiber, aramid fiber, and potassium titanate fiber. Preferred fibrous fillers are glass fiber and carbon fiber.

A fibrous filler may comprise nanofibers.

A said non-fibrous filler may be selected from (i) colorants such as notably a dye, (ii) pigments such as notably titanium dioxide, zinc sulfide and zinc oxide, (iii) light stabilizers, e.g. UV stabilizers, (iv) heat stabilizers, (v) antioxidants such as notably organic phosphites and phosphonites, (vi) acid scavengers, (vii) processing aids, (viii) nucleating agents, (ix) internal lubricants and/or external lubricants, (x) flame retardants, (xi) smoke-suppressing agents, (xii) anti-static agents, (xiii) anti-blocking agents, (xiv) conductivity additives such as notably carbon black, graphite, graphene, metallic filler, and carbon nanofibrils, (xv) plasticizers, (xvi) flow modifiers, (xvii) extenders, (xviii) metal deactivators and combinations comprising one or more of the foregoing non-fibrous fillers.

The non-fibrous fillers may be introduced in the form of powder or flaky particles, and micro powder.

Said composition may define a composite material which could be prepared as described in *Impregnation Techniques* for Thermoplastic Matrix Composites. A Miller and A G Gibson, Polymer & Polymer Composites 4(7), 459-481 (1996), the contents of which are incorporated herein by reference. Preferably, in the method, said polyketone copolymer and said filler means are mixed at an elevated temperature of said polyketone copolymer. Thus suitably, said polyketone copolymer and filler means are mixed whilst the polyketone copolymer is molten. Said elevated temperature is suitably below the decomposition temperature of the polyketone copolymer. Said elevated temperature is preferably at or above soft temperature for said polyketone copolymer. Said elevated temperature is preferably at least 300° C. Advantageously, the molten polyketone copolymer can readily wet the filler and/or penetrate consolidated fillers, such as fibrous mats or woven fabrics, so the composite material prepared comprises the polyketone copolymer and filler means which is substantially uniformly dispersed throughout the polyketone copolymer.

The composite material may be prepared in a continuous process. In this case polyketone copolymer and filler means may be constantly fed to a location wherein they are mixed and heated. An example of such a continuous process is extrusion. Another example (which may be particularly relevant wherein the filler means comprises a fibrous filler) involves causing a continuous filamentous mass to move through a melt comprising said polyketone copolymer. The continuous filamentous mass may comprise a continuous length of fibrous filler or, more preferably, a plurality of continuous filaments which have been consolidated at least to some extent. The continuous fibrous mass may comprise a tow, roving, braid, woven fabric or unwoven fabric. The filaments which make up the fibrous mass may be arranged substantially uniformly or randomly within the mass.

Alternatively, the composite material may be prepared in a discontinuous process. In this case, a predetermined amount of said polyketone copolymer and a predetermined amount of said filler may be selected and contacted and a composite material prepared by causing the polyketone copolymer to melt and causing the polyketone copolymer and filler to mix to form a substantially uniform composite material.

The composite material may be formed into a particulate form for example into pellets or granules. Pellets or granules may have a maximum dimension of less than 25 mm, preferably less than 7.5 mm, more preferably less than 5.0 mm.

Preferably, said filler means comprises one or more fillers selected from glass fiber, carbon fiber, carbon black, graphite, graphene, and a fluoropolymer resin. More preferably, said filler means comprises glass fiber or carbon fiber.

A composition or composite material as described may include 10 to 95 wt. % of said polyketone copolymer and 5 to 90 wt. % of filler. Preferred embodiments include greater than 40 wt. % of filler.

A composition or composite material as described may include 10 to 99 wt. % of said polyketone copolymer and 1 to 90 wt. % of fluoropolymers. The fluoropolymer can be selected from polytetrafluoroethylene (PTFE), poly(ethylene-co-tetrafluoroethylene) (PETFE), poly(tetrafluoroethylene-co-hexafluoropropylene) (PFEP), poly(tetrafluoroethylene-co-perfluoro(alkyl vinyl ether)) (PFA), poly(chlorotrifluoroethylene) (PCTFE), poly(tetrafluoroethylene-co-chlorotrifluoroethylene) (PTFE-CTFE), poly(ethylene-co-chlorotrifluoroethylene) (PECTFE), poly(vinylidene fluoride) (PVDF), and mixture thereof. The selected fluoropolymer has a melting temperature in the range of 150° C. to 400° C. Optionally a portion of the fluoropolymers can be derived from micro-powdered fluoropolymer with particle size ranging from 0.01 to 50 µm. The composite material provides many useful properties such as high glass transition temperature, high dielectric strength, low dielectric constant, low loss (digital signal loss and signal integrity), low coefficient of expansion, chemical resistance and ability to bond with metal.

The said polyketone copolymer and/or composition, as above detailed, can be processed by usual melt processing techniques, including notably extrusion, injection molding, compression molding, thermoforming, blow molding, rotational molding, coating and additive manufacturing, so as to provide shaped articles.

Due to its ultra-high temperature resistance, chemical resistance, good mechanical properties, wear resistance, creep resistance, excellent electrical properties, and ease of fabrication, the said polyketone copolymer can be molded into high-load bearings and bushings, thrust washers and piston rings, wear pads and ball bearing retainers for automotive under-the-hood applications. The said polyketone copolymer can also be molded into spinning disks for metal processing (CNC machining), test sockets for IC testing in semiconductor production, valve seats and frac balls for downhole use in oil and gas exploration.

The said polyketone copolymer alone or in combination with other fillers or polymers such as fluoropolymers can also be extruded or formed into a single layer substrate, or multiplayer structure for electrical or electronics applications, such as, a laminate layer structure in combination with copper clad or other supporting substrate for integrated circuits or the like (e.g., a flexible circuit board), or as a wire wrap for wire, cable or other similar electrical conductor material.

According to certain embodiments, shaped articles are under the form of substantially bidimensional articles, e.g., parts wherein one dimension (thickness or height) is significantly less than the other two characterizing dimensions (width and length), such as notably films, fibers, and sheets.

According to certain embodiments, shaped articles are a substrate, sheet, film, multilayer structure, multilayer sheet, multilayer film, molded part, extruded shape, molded shape, coated part, pellet, powder, foam, fiber, flaked fiber.

According to certain embodiments, shaped article is a single layer substrate or film useful for electronic or electrical applications either alone or as a component of multilayer structure, and optionally further comprises a conductive layer disposed on at least one side thereof. The conductive layer is selected from the group consisting of copper, silver, gold, nickel, titanium, and mixtures thereof.

According to certain embodiment, the shaped substrate or film supports or protects an integrated circuit die and further comprises a conductive pathway on a surface, and provides a conductive pathway within or through the substrate.

According to certain embodiment, the shaped substrate or film is used as a component of an integrated circuit (IC) packaging composition, such as, a chip on lead (COL) package, a chip on flex (COF) package, a lead on chip (LOC) package, optoelectronic package, flat-wire applications, a multi-chip module (MCM) package, a ball grid array (BGA) package, chip scale package (CSP), or a tape automated bonding (TAB) package. Alternatively, the shaped substrate or film can be used as a component of a wafer level integrated circuit package substrate comprising a conductive passageway having one or more of the following: a wire bond, a conductive metal, and a solder bump.

According to other embodiments, the shaped substrate or film may be used in a high speed digital application such as high speed digital antenna, or used in receiving or transmitting microwave signals. "Microwave signals" are intended to mean electromagnetic wavelengths no large than what has historically been referred as "microwave", including wavelengths that are smaller than what has historically been referred to as microwave. The shaped substrate or film may be incorporated into circuit boards, either flexible or rigid. The shaped substrate or film may also be used as all or part of a housing for one or more conductive wires or cables such as a wire or cable wrap or as a housing component of a "flat wire" as commonly use in wiring applications.

According to certain embodiments, shaped articles are provided as three-dimensional parts, e.g., substantially extending in the three dimensions of space in similar manner, including under the form of complex geometries parts, e.g., with concave or convex sections, possibly including undercuts, inserts, and the like.

Another object of the present invention is a method of making a polyketone copolymer, as above set forth, comprising reacting 2H-benzimidazolone of formula, formula IV:

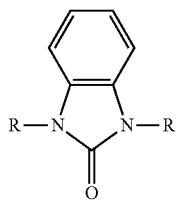

IV with a mixture of compound 4,4'-dihalobenzophenone of formula, formula V:

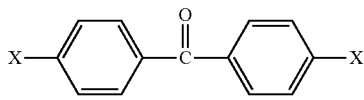

V and/or compound 1,4-bis(4-halobenzoyl)benzene of formula, formula VIa:

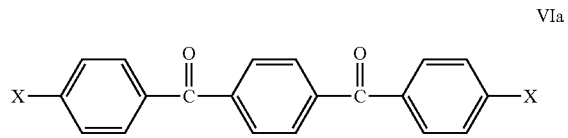

VIa and/or compound 1,3-bis(4-halobenzoyl)benzene of formula, formula VIb

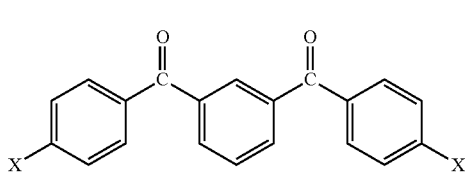

VIb in a molar ratio (V:(VIa+VIb)) of 99:1 to 0:100, a molar ratio (VIa:VIb) of 100:0 to 0:100 when V:(VIa+VIb) is greater than 0:100, and a molar ratio (VIa:VIb) of 99:1 to 1:99 when V:(VIa+VIb) is 0:100, in a hydrophilic organic solvent such as dimethylacetamide (DMAc), or N-cyclohexyl-2-pyrrolidone (CHP), or N-Methyl-2-pyrrolidone (NMP) or sulfolane in the presence of an alkali metal carbonate or a mixture of alkali metal carbonate, wherein R is selected from an alkali metal and a hydrogen atom, each X is selected from a chlorine and fluorine atom.

Suitably, the number of moles of monomers which include chlorine or fluorine atoms which are polycondensed in the method are in slight molar excess over the number of moles of monomers which include alkali metal or hydrogen end groups.

The said polyketone copolymer of the present invention can be prepared in solution by heating the monomers dissolved in hydrophilic organic solvent such as dimethylacetamide (DMAc), or N-Methyl-2-pyrrolidone (NMP), or N-cyclohexyl-2-pyrrolidone (CHP) or sulfolane with anhydrous alkali metal carbonate or a mixture of alkali metal carbonates. The alkali metal carbonates are typically sodium carbonate, potassium carbonate or a mixture of sodium carbonate, potassium carbonate and cesium carbonate. The alkali metal carbonates can be anhydrous. Water formed during initial reaction can be removed, e.g., by dehydration via azeotropic distillation with organic solvent such as toluene or xylene or chlorobenzene, prior to reaching the polymerization temperature.

The total amount of alkali metal carbonate used can be such that there is at least 1 atom of alkali metal for each NH group. An excess of alkali metal carbonate can be employed, and there may be 1.0 to 1.2 atoms of alkali metal per NH group.

In various embodiments of the present invention, the polymerization is carried out in hydrophilic organic solvent such as dimethylacetamide (DMAc), or N-Methyl-2-pyrrolidone (NMP), or N-cyclohexyl-2-pyrrolidone (CHP) or sulfolane at temperature below 300° C. under ambient pressure or pressurized environment. In certain embodiments, the polymerization is carried out at temperatures from about 130° C. to about 290° C. In some embodiments, the polymerization temperature is from about 150° C. to about 280° C.

It is preferable that the monomers (IV), (V) and (VI) are heated, in the method of the invention, at a first temperature of at least 130° C., preferably at least 140° C., more preferably at least 150° C. in presence of $K_2CO_3$ and azeotropic solvent to form NK group. The reaction is generally pursued by heating the resulting mixture at a temperature of at about 160° C. to about 180° C. to dehydrate the reaction mixture with removal of water via azeotropic distillation. The dehydrated reaction mixture is then heated to a temperature of preferably at least 190° C., preferably at least 230° C., and more preferably at least 260° C., at a temperature ramp rate of less than 20° C./minute, preferably less than 10° C./minute and/or at a temperature ramp rate of less than 5° C./minute. Once the final target temperature is attained, the reaction is generally continued for a limited time at this temperature, before being terminated.

It is also preferable that the monomer (IV) is heated, in the method of the invention, at a first temperature of at least 130° C., preferably at least 140° C., more preferably at least 150° C. in presence of $K_2CO_3$ and azeotropic solvent to form NK group. The reaction is generally pursued by heating the resulting mixture at a temperature of at about 160° C. to about 180° C. to dehydrate the reaction mixture with removal of water via azeotropic distillation. Monomers (V) and (VI) are then added to the dehydrated reaction mixture, and the reaction mixture is then heated to a temperature of preferably at least 190° C., preferably at least 230° C., and more preferably at least 260° C., at a temperature ramp rate of less than 20° C./minute, preferably less than 10° C./minute and/or at a temperature ramp rate of less than 5° C./minute. Once the final target temperature is attained, the reaction is generally continued for a limited time at this temperature, before being terminated.

EXAMPLES

Figure 4:
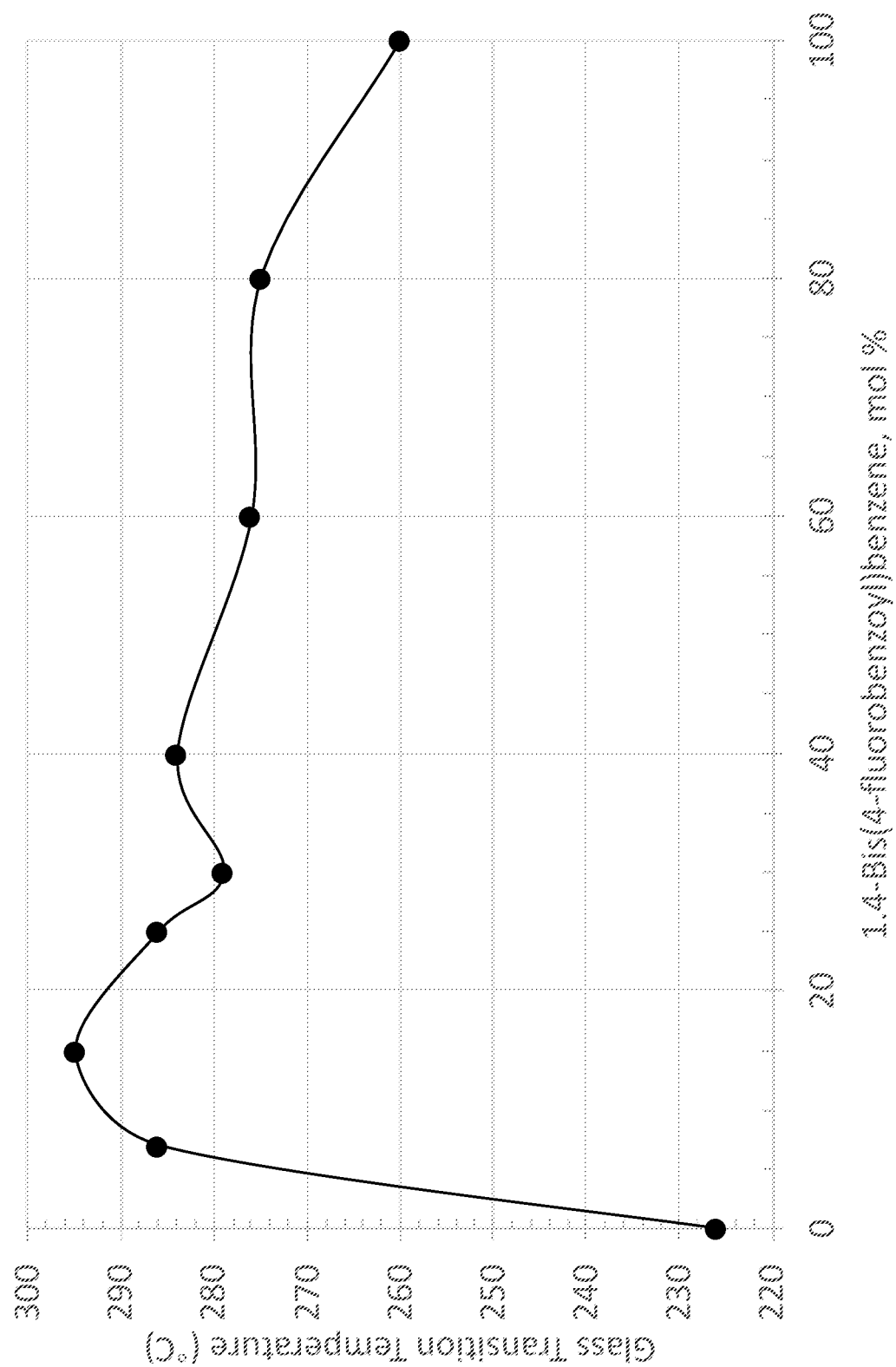
FIG. 4 is a plot of glass transition temperature ($T_g$) of the polyketone copolymers of the example vs the molar amount (mol %) of 1,4-bis(4-fluorobenzoyl)benzene for the synthesis of the polyketone copolymers. The molar percentage (mol %) of 1,4-bis(4-fluorobenzoyl)benzene is referred to molar percentage (mol %) of 1,4-bis(4-fluorobenzoyl)benzene in total molar amount of 4,4'-difluorobenzophenone and 1,4-bis(4-fluorobenzoyl)benzene. The glass transition temperature of the polyketone polymer with 100% 4,4'-difluorobenzophenone is cited from Chinese Patent CN103450478B.

Polyketone copolymers from 2H-benzimidazol-2-one with 4,4'-difluorobenzophenone and 1,4-bis(4-fluorobenzoyl)benzene as comonomers The following examples are illustrative of the practice of the present invention and are not intended in any way to limit their scope. The synthesis conditions of each example are summarized in Table 1 and the results of each example are summarized in Table 2. The surprising and unexpected high $T_g$ of the polyketone copolymer with incorporation of 1,4-bis(4-fluorobenzoyl)benzene is illustrated in FIG. 4.

Example 1: Preparation of Polyketone-1 Copolymer 75/25

In a 250 mL 3-neck reaction flask equipped with a mechanical stirrer, an argon inlet tube, a thermocouple plunging in the reaction medium, and a Dean-Stark trap with a condenser, were introduced 50.0 g of N-cyclohexyl-2-pyrrolidone (CHP), 5.00 g (37.27 mmol) of 2H-benzimidazol-2-one, 5.67 g (41.00 mmol) of anhydrous potassium carbonate and 20 ml xylene. The flask content was evacuated under vacuum and then filled with high purity argon. The reaction mixture was then placed under a constant argon purge (40 mL/min).

The reaction mixture was heated slowly to 155° C. and kept at 155° C. for 30 minutes. The reaction mixture was then heated to 175° C. and kept at 175° C. for 90 minutes. During this process xylene along with water were distilled and collected in Dean-Stark trap and removed. At end of 90 minutes reaction, the reaction mixture was cooled to 155° C., 6.16 g (28.24 mmol) of 4,4'-difluorobenzophenone and 3.03 g (9.41 mmol) of 1,4-bis(4-fluorobenzoyl)benzene were added along with 10 ml xylene. The reaction mixture was heated to 175° C. over 10 minutes. The reaction mixture was kept at 175° C. for 30 minutes, and during this process, xylene along with any residual water was distilled and collected in Dean-Stark trap and removed. The reaction mixture was then heated from 175° C. to 240° C. in 30 minutes and the polymerization was kept at 240° C. for 60 minutes. The reaction mixture became viscous solution after 30 minutes reaction at 240° C., and became highly viscous (climbing up the stirring rod) after 60 minutes reaction at 240° C. 25 ml CHP was added to dilute the reaction mixture. After 60 minutes reaction at 240° C., the viscous reaction mixture was cooled to less than 100° C. under stirring. 150 ml de-ionized water was added to the reaction mixture once temperature was less than 100° C. and the mixture was transferred to a Waring blender. It was mixed for 3 minutes and filtered. The filtered liquid was collected for solvent recovery. The filtered solid was blended with another 75 ml de-ionized water for 3 minutes in a Waring blender and filtered to recover any residual solvent. The filtered liquid was combined with previous filtered liquid for solvent recovery.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 250 ml flask along with 150 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 15.0 g yellow powder. The structure of the obtained copolymer can be sketched, in terms of repeating units, as follows:

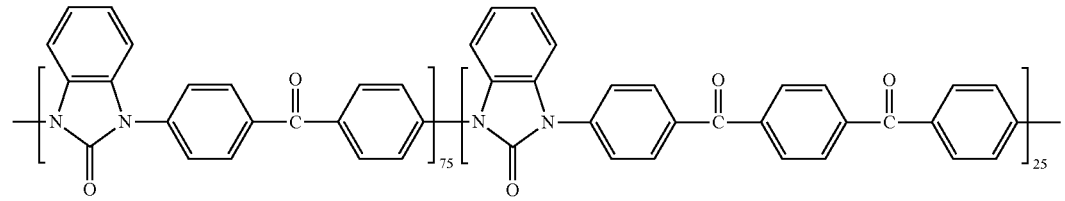

The inherent viscosity (IV) of the copolymer, measured at 0.5 wt/vol % in 96% $H_2SO_4$ at 30° C., as above detailed, was found to be 2.68 dL/g. DSC analysis from second heating scan from 50° C. to 430° C. showed a Tg of 286° C. The results are summarized in Table 1 and Table 2.

Example 2: Preparation of Polyketone-2 Copolymer 60/40

In a 250 mL 3-neck reaction flask equipped with a mechanical stirrer, an argon inlet tube, a thermocouple plunging in the reaction medium, and a Dean-Stark trap with a condenser, were introduced 50.0 g of N-cyclohexyl-2-pyrrolidone (CHP), 4.80 g (35.78 mmol) of 2H-benzimidazol-2-one, 5.44 g (39.36 mmol) of anhydrous potassium carbonate and 20 ml xylene. The flask content was evacuated under vacuum and then filled with high purity argon. The reaction mixture was then placed under a constant argon purge (40 mL/min).

The reaction mixture was heated slowly to 155° C. and kept at 155° C. for 30 minutes. The reaction mixture was then heated to 175° C. and kept at 175° C. for 90 minutes. During this process xylene along with water was distilled and collected in Dean-Stark trap and removed. At end of 90 minutes reaction, the reaction mixture was cooled to 155° C., 4.73 g (21.68 mmol) of 4,4'-difluorobenzophenone and 4.66 g (14.46 mmol) of 1,4-bis(4-fluorobenzoyl)benzene were added along with 10 ml xylene. The reaction mixture was heated to 175° C. over 10 minutes. The reaction mixture was kept at 175° C. for 30 minutes, and during this process, xylene along with any residual water was distilled and collected in Dean-Stark trap and removed. The reaction mixture was then heated from 175° C. to 210° C. over 15 minutes and heated to 240° C. over 10 minutes. The polymerization was kept at 240° C. for 30 minutes. The reaction mixture became viscous solution after 20 minutes reaction at 240° C., and became a highly viscous (climbing up the stirring rod) after 25 minutes reaction at 240° C. 25 ml CHP was added to dilute reaction mixture. At end of 30 minutes reaction at 240° C., the viscous reaction mixture was cooled to less than 100° C. under stirring. 150 ml de-ionized water was added to the reaction mixture once temperature was less than 100° C. and the mixture was transferred to a Waring blender. It was mixed for 3 minutes and filtered. The filtered liquid was collected for solvent recovery. The filtered solid was blended with another 75 ml de-ionized water for 3 minutes in a Waring blender and filtered to recover any residual solvent. The filtered liquid was combined with previous filtered liquid for solvent recovery.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 250 ml flask along with 150 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 13.2 g yellow powder. The structure of the obtained copolymer can be sketched, in terms of repeating units, as follows:

ated under vacuum and then filled with high purity argon. The reaction mixture was then placed under a constant argon purge (40 mL/min).

The reaction mixture was heated slowly to 155° C. and kept at 155° C. for 30 minutes. The reaction mixture was then heated to 175° C. and kept at 175° C. for 90 minutes. During this process xylene along with water was distilled and collected in Dean-Stark trap and removed. At end of 90 minutes reaction, the reaction mixture was cooled to 155° C., 3.02 g (13.85 mmol) of 4,4'-difluorobenzophenone and 6.70 g (20.78 mmol) of 1,4-bis(4-fluorobenzoyl)benzene were added along with 10 ml xylene. The reaction mixture was heated to 175° C. over 10 minutes. The reaction mixture was kept at 175° C. for 30 minutes, and during this process, xylene along with any residual water was distilled and collected in Dean-Stark trap and removed. The reaction mixture was then heated from 175° C. to 210° C. over 15 minutes and heated to 240° C. over 10 minutes. The polymerization was kept at 240° C. for 90 minutes. The reaction mixture became viscous solution after 60 minutes reaction at 240° C. and became highly viscous after 90 minutes reaction at 240° C. 25 ml CHP was added to dilute the reaction mixture. The viscous reaction mixture was cooled to less than 100° C. under stirring. 150 ml de-ionized water was added to the reaction mixture once temperature was less than 100° C. and the mixture was transferred to a Waring blender. It was mixed for 3 minutes and filtered. The filtered liquid was collected for solvent recovery. The filtered solid was blended with another 75 ml de-ionized water for 3 minutes in a Waring blender and filtered to recover any residual solvent. The filtered liquid was combined with previous filtered liquid for solvent recovery.

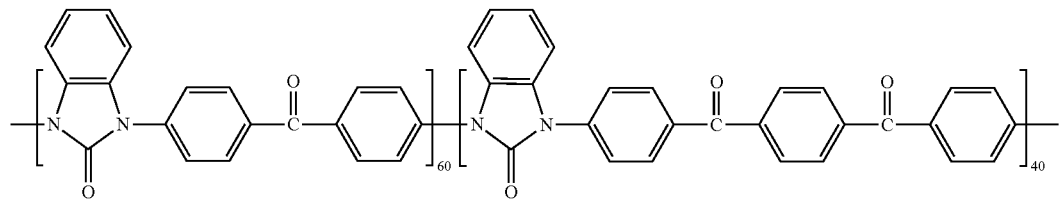

The inherent viscosity (IV) of the copolymer, measured at 0.5 wt/vol % in 96% $H_2SO_4$ at 30° C., as above detailed, was found to be 2.72 dL/g. DSC analysis from second heating scan from 50° C. to 430° C. showed a $T_g$ of 284° C. The results are summarized in Table 1 and Table 2.

Example 3: Preparation of Polyketone-3 Copolymer 40/60

In a 250 mL 3-neck reaction flask equipped with a mechanical stirrer, an argon inlet tube, a thermocouple plunging in the reaction medium, and a Dean-Stark trap with a condenser, were introduced 50.0 g of N-cyclohexyl-2-pyrrolidone (CHP), 4.60 g (34.29 mmol) of 2H-benzimidazol-2-one, 5.21 g (37.72 mmol) of anhydrous potassium carbonate and 20 ml xylene. The flask content was evacu- Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 250 ml flask along with 150 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 15.1 g yellow powder. The structure of the obtained copolymer can be sketched, in terms of repeating units, as follows:

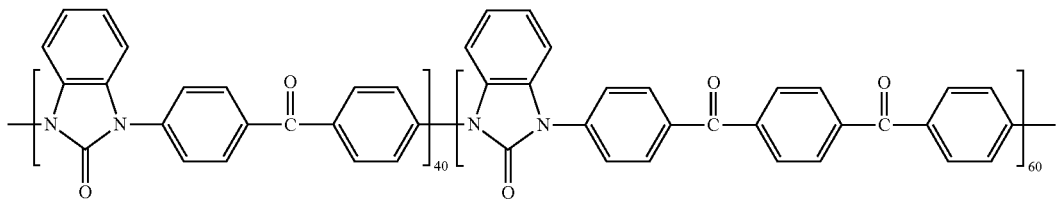

The inherent viscosity (IV) of the copolymer, measured at 0.5 wt/vol % in 96% $H_2SO_4$ at 30° C., as above detailed, was found to be 0.99 dL/g. DSC analysis from second heating scan from 50° C. to 430° C. showed a $T_g$ of 276° C. The results are summarized in Table 1 and Table 2.

Example 4: Preparation of Polyketone-4 Copolymer 85/15

In a 250 mL 3-neck reaction flask equipped with a mechanical stirrer, an argon inlet tube, a thermocouple plunging in the reaction medium, and a Dean-Stark trap with a condenser, were introduced 50.0 g of N-cyclohexyl-2-pyrrolidone (CHP), 5.10 g (38.02 mmol) of 2H-benzimidazol-2-one, 5.78 g (41.82 mmol) of anhydrous potassium carbonate and 20 ml xylene. The flask content was evacuated under vacuum and then filled with high purity argon. The reaction mixture was then placed under a constant argon purge (40 mL/min).

The reaction mixture was heated slowly to 155° C. and kept at 155° C. for 30 minutes. The reaction mixture was then heated to 175° C. and kept at 175° C. for 90 minutes. During this process xylene along with water was distilled and collected in Dean-Stark trap and removed. At end of 90 minutes reaction, the reaction mixture was cooled to 155° C., 7.12 g (32.64 mmol) of 4,4'-difluorobenzophenone and 1.86 g (5.76 mmol) of 1,4-bis(4-fluorobenzoyl)benzene were added along with 10 ml xylene. The reaction mixture was heated to 175° C. over 10 minutes. The reaction mixture was kept at 175° C. for 30 minutes, and during this process, xylene along with any residual water was distilled and collected in Dean-Stark trap and removed. The reaction mixture was then heated from 175° C. to 210° C. over 15 minutes and heated to 240° C. over 10 minutes. The reaction mixture became highly viscous during this process and the reaction mixture was further heated to 260° C. over 10 minutes. The reaction mixture became highly viscous and 25 ml CHP was added to dilute the reaction mixture. The polymerization was kept at 260° C. for 20 minutes. The reaction mixture became highly viscous after 20 minutes reaction at 260° C., and the highly viscous reaction mixture was cooled to less than 100° C. under stirring. 150 ml de-ionized water was added to the reaction mixture once temperature was less than 100° C. and the mixture was transferred to a Waring blender. It was mixed for 3 minutes and filtered. The filtered liquid was collected for solvent recovery. The filtered solid was blended with another 75 ml de-ionized water for 3 minutes in a Waring blender and filtered to recover any residual solvent. The filtered liquid was combined with previous filtered liquid for solvent recovery.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 250 ml flask along with 150 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 14.7 g yellow powder. The structure of the obtained copolymer can be sketched, in terms of repeating units, as follows:

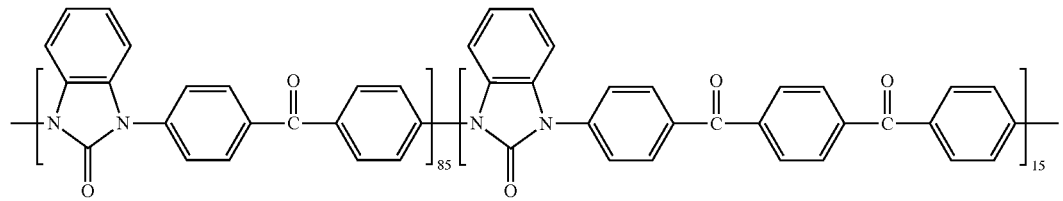

The inherent viscosity (IV) of the copolymer, measured at 0.5 wt/vol % in 96% $H_2SO_4$ at 30° C., as above detailed, was found to be 0.88 dL/g. DSC analysis (FIG. 1) from second heating scan from 50° C. to 430° C. showed a $T_g$ of 295° C. The results are summarized in Table 1 and Table 2.

Example 5: Preparation of Polyketone-5 Copolymer 20/80

In a 250 mL 3-neck reaction flask equipped with a mechanical stirrer, an argon inlet tube, a thermocouple plunging in the reaction medium, and a Dean-Stark trap with a condenser, were introduced 50.0 g of N-cyclohexyl-2-pyrrolidone (CHP), 4.40 g (32.80 mmol) of 2H-benzimidazol-2-one, 4.99 g (36.08 mmol) of anhydrous potassium carbonate and 20 ml xylene. The flask content was evacuated under vacuum and then filled with high purity argon. The reaction mixture was then placed under a constant argon purge (40 mL/min).

The reaction mixture was heated slowly to 155° C. and kept at 155° C. for 30 minutes. The reaction mixture was then heated to 175° C. and kept at 175° C. for 90 minutes. During this process xylene along with water was distilled and collected in Dean-Stark trap and removed. At end of 90 minutes reaction, the reaction mixture was cooled to 155° C. and 1.45 g (6.63 mmol) of 4,4'-difluorobenzophenone and 8.54 g (26.50 mmol) of 1,4-bis(4-fluorobenzoyl)benzene were added along with 10 ml xylene. The reaction mixture was heated to 175° C. over 10 minutes. The reaction mixture was kept at 175° C. for 30 minutes, and during this process, xylene along with any residual water was distilled and collected in Dean-Stark trap and removed. The reaction mixture was then heated from 175° C. to 210° C. over 15 minutes and heated to 240° C. over 10 minutes. The polymerization was kept at 240° C. for 30 minutes. The reaction mixture became viscous after 15 minutes reaction at 240° C., and highly viscous after 30 minutes reaction at 240° C. Additional CHP (25 ml) was added to dilute the reaction mixture, the reaction was continued for another 7 minutes and the mixture became highly viscous. The highly viscous reaction mixture was cooled to less than 100° C. under stirring. 150 ml de-ionized water was added to the reaction mixture once temperature was less than 100° C. and the mixture was transferred to a Waring blender. It was mixed for 3 minutes and filtered. The filtered liquid was collected for solvent recovery. The filtered solid was blended with another 75 ml de-ionized water for 3 minutes in a Waring blender and filtered to recover any residual solvent. The filtered liquid was combined with previous filtered liquid for solvent recovery.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 250 ml flask along with 150 ml de-ionized water. The mixture was stirred overnight under gentle reflux. It was then filtered hot. The ion conductivity of the filtered liquid was tested, and the process was repeated until the ion conductivity of the filtered liquid is less than 3. The filtered powder was then dried at 160° C. under vacuum for 12 hours yielding 14.2 g yellow powder. The structure of the obtained copolymer can be sketched, in terms of repeat units, as follows:

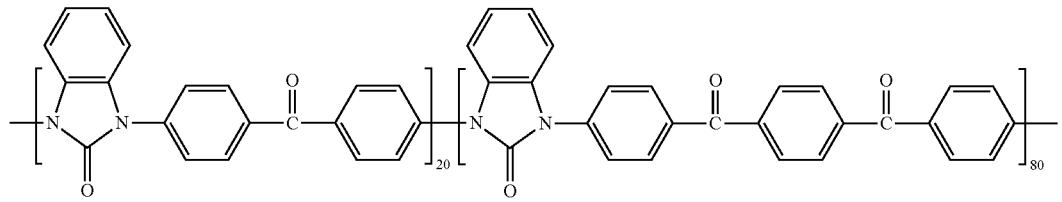

The inherent viscosity (IV) of the copolymer, measured at 0.5 wt/vol % in 96% $H_2SO_4$ at 30° C., as above detailed, was found to be 2.66 dL/g. DSC analysis from second heating scan from 50° C. to 430° C. showed a $T_g$ of 275° C. The results are summarized in Table 1 and Table 2.

Example 6: Preparation of Polyketone-6 Polymer 0/100

In a 250 mL 3-neck reaction flask equipped with a mechanical stirrer, an argon inlet tube, a thermocouple plunging in the reaction medium, and a Dean-Stark trap with a condenser, were introduced 50.0 g of N-cyclohexyl-2-pyrrolidone (CHP), 4.20 g (31.31 mmol) of 2H-benzimidazol-2-one, 4.76 g (34.44 mmol) of anhydrous potassium carbonate and 20 ml xylene. The flask content was evacuated under vacuum and then filled with high purity argon. The reaction mixture was then placed under a constant argon purge (40 mL/min).

The reaction mixture was heated slowly to 155° C. and kept at 155° C. for 30 minutes. The reaction mixture was then heated to 175° C. and kept at 175° C. for 90 minutes. During this process xylene along with water was distilled and collected in Dean-Stark trap and removed. At end of 90 minutes reaction, the reaction mixture was cooled to 155° C., 10.20 g (31.62 mmol) of 1,4-bis(4-fluorobenzoyl)benzene were added along with 20 ml xylene. The reaction mixture was heated to 175° C. over 10 minutes. The reaction mixture was kept at 175° C. for 30 minutes, and during this process, xylene along with any residual water was distilled and collected in Dean-Stark trap and removed. The reaction mixture was then heated from 175° C. to 210° C. over 15 minutes and heated to 240° C. over 10 minutes. The polymerization was kept at 240° C. for 45 minutes. The reaction mixture became viscous after 15 minutes reaction at 240° C., and highly viscous after 30 minutes reaction at 240° C. Additional CHP (25 ml) was added to dilute the reaction mixture, the reaction was continued for another 15 minutes at 240° C. and the mixture became highly viscous solution (climbing up the stirring rod). The highly viscous reaction mixture was cooled to less than 100° C. under stirring. 150 ml de-ionized water was added to the reaction mixture once temperature was less than 100° C. and the mixture was transferred to a Waring blender. It was mixed for 3 minutes and filtered. The filtered liquid was collected for solvent recovery. The filtered solid was blended with another 75 ml de-ionized water for 3 minutes in a Waring blender and filtered to recover any residual solvent. The filtered liquid was combined with previous filtered liquid for solvent recovery.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 250 ml flask along with 150 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 12.7 g yellow powder. The structure of the obtained polymer can be sketched, in terms of repeating units, as follows:

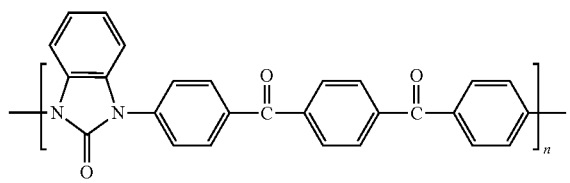

Figure 2:
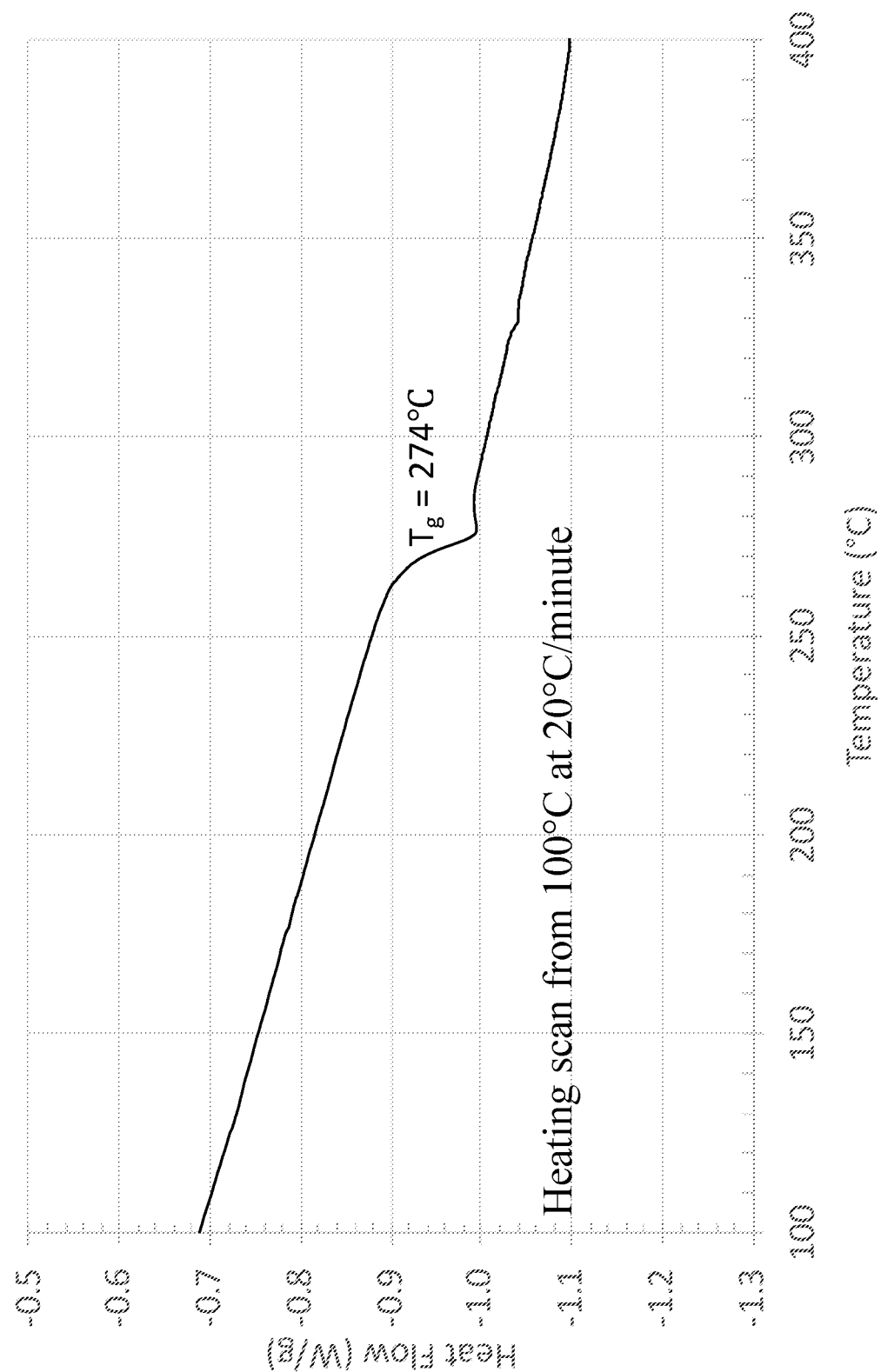
FIG. 2 is a graphical plot of DSC heating scan curve at 20° C./minute for the polyketone copolymer of Example 6.

The inherent viscosity (IV) of the polyketone polymer, measured at 0.5 wt/vol % in 96% $H_2SO_4$ at 30° C., as above detailed, was found to be 1.29 dL/g. DSC analysis (FIG. 2) from second heating scan from 50° C. to 430° C. showed a $T_g$ of 260° C. The results are summarized in Table 1 and Table 2.

Example 7: Preparation of Polyketone-7 Copolymer 93/7

In a 250 mL 3-neck reaction flask equipped with a mechanical stirrer, an argon inlet tube, a thermocouple plunging in the reaction medium, and a Dean-Stark trap with a condenser, were introduced 50.0 g of N-cyclohexyl-2-pyrrolidone (CHP), 4.60 g (34.29 mmol) of 2H-benzimidazol-2-one, 5.21 g (37.72 mmol) of anhydrous potassium carbonate and 20 ml xylene. The flask content was evacuated under vacuum and then filled with high purity argon. The reaction mixture was then placed under a constant argon purge (40 mL/min).

The reaction mixture was heated slowly to 155° C. and kept at 155° C. for 30 minutes. The reaction mixture was then heated to 175° C. and kept at 175° C. for 90 minutes. During this process xylene along with water was distilled and collected in Dean-Stark trap and removed. At end of 90 minutes reaction, the reaction mixture was cooled to 155° C. and 7.03 g (32.21 mmol) of 4,4'-difluorobenzophenone and 0.78 g (2.42 mmol) of 1,4-bis(4-fluorobenzoyl)benzene were added along with 10 ml xylene. The reaction mixture was heated to 175° C. over 10 minutes. The reaction mixture was kept at 175° C. for 30 minutes, and during this process, xylene along with any residual water was distilled and collected in Dean-Stark trap and removed. The reaction mixture was then heated from 175° C. to 210° C. over 15 minutes and heated to 240° C. over 10 minutes. The reaction was kept at 240° C. for 15 minutes and the reaction mixture became highly viscous paste. The reaction mixture was further heated to 260° C. over 5 minutes. The reaction mixture became highly viscous after 15 minutes reaction at 260° C. Additional CHP (25 ml) was added to dilute the reaction mixture. The polymerization was kept at 260° C. for another 20 minutes and the reaction mixture became highly viscous. The highly viscous reaction mixture was cooled to less than 100° C. under stirring. 150 ml de-ionized water was added to the reaction mixture once temperature was less than 100° C. and the mixture was transferred to a Waring blender. It was mixed for 3 minutes and filtered. The filtered liquid was collected for solvent recovery. The filtered solid was blended with another 75 ml de-ionized water for 3 minutes in a Waring blender and filtered to recover any residual solvent. The filtered liquid was combined with previous filtered liquid for solvent recovery.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 250 ml flask along with 150 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 12.5 g yellow powder. The structure of the obtained copolymer can be sketched, in terms of repeating units, as follows:

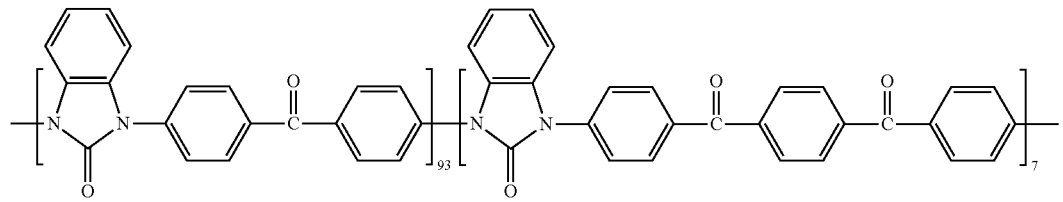

The inherent viscosity (IV) of the copolymer, measured at 0.5 wt/vol % in 96% $H_2SO_4$ at 30° C., as above detailed, was found to be 0.67 dL/g. DSC analysis from second heating scan from 50° C. to 430° C. showed a $T_g$ of 286° C. The results are summarized in Table 1 and Table 2.

Example 8: Preparation of Polyketone-8 Copolymer 70/30

In a 250 mL 3-neck reaction flask equipped with a mechanical stirrer, an argon inlet tube, a thermocouple plunging in the reaction medium, and a Dean-Stark trap with a condenser, were introduced 50.0 g of N-cyclohexyl-2-pyrrolidone (CHP), 4.90 g (36.53 mmol) of 2H-benzimidazol-2-one, 5.55 g (40.18 mmol) of anhydrous potassium carbonate and 20 ml xylene. The flask content was evacuated under vacuum and then filled with high purity argon. The reaction mixture was then placed under a constant argon purge (40 mL/min).

The reaction mixture was heated slowly to 155° C. and kept at 155° C. for 30 minutes. The reaction mixture was then heated to 175° C. and kept at 175° C. for 90 minutes. During this process xylene along with water was distilled and collected in Dean-Stark trap and removed. At end of 90 minutes reaction, the reaction mixture was cooled to 155° C., 5.72 g (26.21 mmol) of 4,4-difluorobenzophenone and 3.62 g (11.23 mmol) of 1,4-bis(4-fluorobenzoyl)benzene were added along with 10 ml xylene. The reaction mixture was heated to 175° C. over 10 minutes. The reaction mixture was kept at 175° C. for 30 minutes, and during this process, xylene along with any residual water was distilled and collected in Dean-Stark trap and removed. The reaction mixture was then heated from 175° C. to 200° C. over 7 minutes, from 200° C. to 220° C. over 8 minutes. The reaction was kept at 220° C. for 5 minutes and heated to 240° C. over 10 minutes. The polymerization was kept at 240° C. for 2 hours. The reaction mixture became viscous after 45 minutes reaction at 240° C., and highly viscous after 1.5 hours reaction at 240° C. The reaction was continued for another 30 minutes at 240° C. At end of 2 hours reaction, the highly viscous reaction mixture was cooled to less than 100° C. under stirring. 150 ml de-ionized water was added to the reaction mixture once temperature was less than 100° C. and the mixture was transferred to a Waring blender. It was mixed for 3 minutes and filtered. The filtered liquid was collected for solvent recovery. The filtered solid was blended with another 75 ml de-ionized water for 3 minutes in a Waring blender and filtered to recover any residual solvent. The filtered liquid was combined with previous filtered liquid for solvent recovery.

Filtered solid was transferred to a Waring blender along with 300 ml de-ionized water. It was blended for 3 minutes and filtered. The ion conductivity of filtered liquid was tested, and the process was repeated until the ion conductivity of the filtered liquid was less than 10. The solid was then transferred to a 250 ml flask along with 150 ml de-ionized water. The mixture was stirred overnight under gentle reflux. It was then filtered hot. The ion conductivity of the filtered liquid was tested, and the process was repeated until the ion conductivity of the filtered liquid was less than 3. The filtered powder was then dried at 160° C. under vacuum for 12 hours yielding 15.2 g yellow powder. The structure of the obtained polymer can be sketched, in terms of repeating units, as follows:

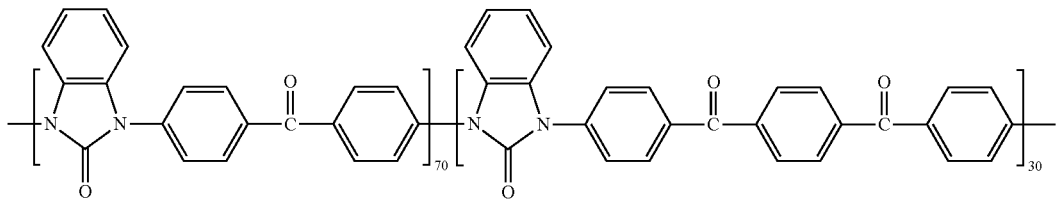

Figure 3:
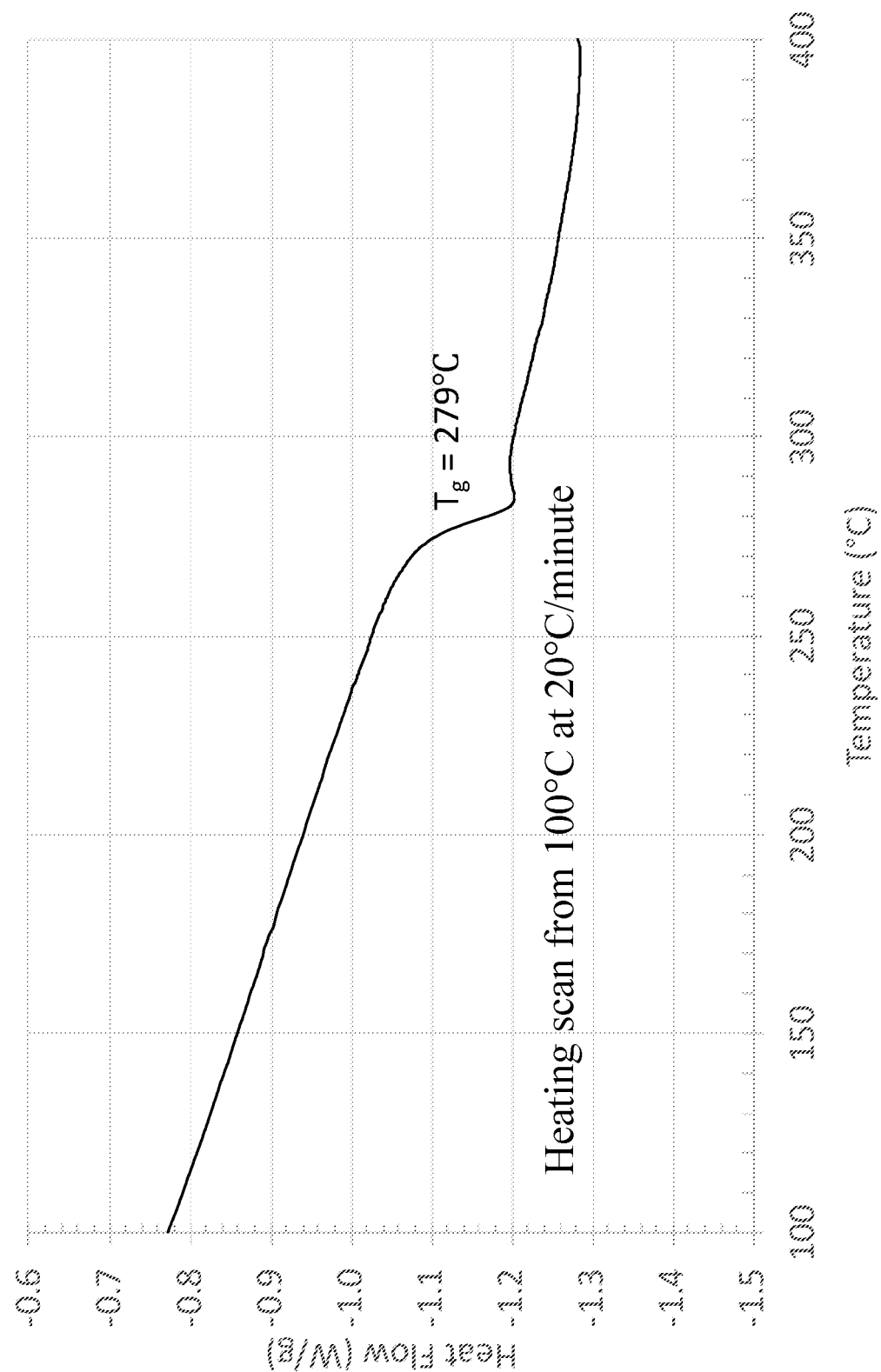
FIG. 3 is a graphical plot of DSC heating scan curve at 20° C./minute for the polyketone copolymer of Example 8

The inherent viscosity (IV) of the copolymer, measured at 0.5 wt/vol % in 96% $H_2SO_4$ at 30° C., as above detailed, was found to be 0.69 dL/g. DSC analysis (FIG. 3) from second heating scan from 50° C. to 430° C. showed a $T_g$ of 279° C. The results are summarized in Table 1 and Table 2.

TABLE 1

Summary of the synthesis conditions for the examples

| Example | Molar ratio of DFB:DFBB | Molar ratio of (DFB + DFBB):BI | Molar ratio of $K_2CO_3$:BI |
| --- | --- | --- | --- |
| Example 1 | 75/25 | 1.010/1.00 | 1.10/1.00 |
| Example 2 | 60/40 | 1.010/1.00 | 1.10/1.00 |
| Example 3 | 40/60 | 1.010/1.00 | 1.10/1.00 |
| Example 4 | 85/15 | 1.010/1.00 | 1.10/1.00 |
| Example 5 | 20/80 | 1.010/1.00 | 1.10/1.00 |
| Example 6 | 0/100 | 1.010/1.00 | 1.10/1.00 |
| Example 7 | 93/7 | 1.010/1.00 | 1.10/1.00 |
| Example 8 | 70/30 | 1.025/1.00 | 1.10/1.00 |

In Table 1, the following abbreviations are used: DFB refers to 4,4'-difluorobenzophenone; DFBB refers to 1,4-bis(4-fluorobenzoyl)benzene; and BI refers to 2H-benzimidizol-2-one.

TABLE 2

Summary of properties of polymers for the examples

| Example | Molar ratio of DFB:DFBB | Glass transition temperature $T_g$ (° C.) | Inherent viscosity IV (dL/g) |
| --- | --- | --- | --- |
| Example 1 | 75/25 | 286 | 2.68 |
| Example 2 | 60/40 | 284 | 2.72 |
| Example 3 | 40/60 | 276 | 0.99 |
| Example 4 | 85/15 | 295 | 0.88 |
| Example 5 | 20/80 | 275 | 2.66 |
| Example 6 | 0/100 | 260 | 1.29 |
| Example 7 | 93/7 | 286 | 0.67 |
| Example 8 | 70/30 | 279 | 0.69 |

In Table 2, the following abbreviations are used: DFB refers to 4,4'-difluorobenzophenone; and DFBB refers to 1,4-bis(4-fluorobenzoyl)benzene.

It will be appreciated that the polyketone copolymer described in the Examples have unexpectly high glass transition temperatures from 275 to 295° C. They may therefore be advantageously used for production of components and devices that can be used in high temperature and challenging environment in oil and gas exploration and production, metal processing, electrical and electronics application, automotive applications, and life science and medical applications.

The invention is not restricted to the details of the foregoing embodiment(s). The invention extends to any novel one, or any novel combination, of the features disclosed in this specification (including any accompanying claims, abstract and drawings), or to any one specific embodiment, or any of several various possible combinations, of the steps of any method or process so disclosed.

The foregoing examples are merely illustrative of the invention, serving to illustrate only some of the features of the present invention. The appended claims are intended to claim the invention as broadly as it has been conceived and the examples herein presented are illustrative of selected embodiments from a manifold of all possible embodiments, suggesting or implying other embodiments of the chemistry described herein. Accordingly it is Applicant's intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of". Where necessary, ranges have been supplied, those ranges are inclusive of all sub-ranges there between. Such ranges may be viewed as a Markush group or groups consisting of differing pairwise numerical limitations which group or groups is or are fully defined by its lower and upper bounds, increasing in a regular fashion numerically from lower bounds to upper bounds. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims. All United States patents (and patent applications) referenced herein are herewith and hereby specifically incorporated by reference in their entirety as though set forth in full.

Other than in the working examples or where otherwise indicated, all numbers expressing amounts of materials, reaction conditions, time durations, quantified properties of materials, and so forth, stated in the specification are to be understood as being modified in all instances by the term "about."

It will also be understood that any numerical range recited herein is intended to include all sub-ranges within that range.

It will be further understood that any compound, material or substance which is expressly or implicitly disclosed in the specification and/or recited in a claim as belonging to a group of structurally, compositionally and/or functionally related compounds, materials or substances includes individual representatives of the group and all combinations thereof.

The invention claimed is:

1. A polymeric composition comprising a copolymer having at least two recurring units selected from the group of recurring units consisting of a first recurring unit of formula I:

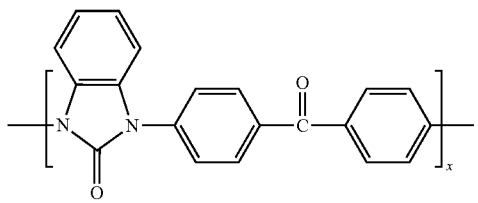

a second recurring unit of formula II:

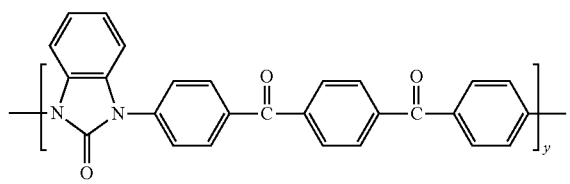

and a third recurring unit of formula III:

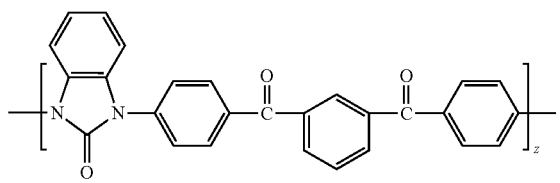

wherein the value of the subscript x ranges from 0 to 5000, the value of the subscript y ranges from 0 to 5000, the value of the subscript z ranges from 0 to 5000, subject to the limitation that the ratio of x:(y+z) ranges from 99:1 to 0:100; the ratio of y:z ranges from 100:0 to 0:100 when x is greater than 0, and the ratio of y:z ranges from 99:1 to 1:99 when x is 0; wherein said copolymer has an inherent solution viscosity greater than 0.1 dL/g, and a glass transition temperature $T_g$ greater than 240° C.

2. The polymeric composition according to claim 1, wherein the copolymer consists of recurring unit of formula I and recurring unit of formula II, and wherein the ratio of x:y ranges from 99:1 to 1:99.

3. The polymeric composition according to claim 1, wherein the copolymer consists of recurring unit of formula I and recurring unit of formula III, and wherein the ratio of x:z ranges from 99:1 to 1:99.

4. The polymeric composition according to claim 1, wherein the copolymer consists of recurring unit of formula II and recurring unit of formula III, and wherein the ratio of y:z ranges from 99:1 to 1:99.

5. The polymeric composition according to claim 1, wherein the copolymer has an inherent solution viscosity of at least 0.3 dL/g and less than 3.0 dL/g.

6. The polymeric composition according to claim 1, wherein the copolymer has a glass transition temperature $T_g$ of greater than 265° C.

7. A polymeric composition according to claim 1, further comprising a polymer selected from the group consisting of polybenzimidazole, polyarylamides, polysulfones, polyketones, polyimides, polyetherimides, polyphenylenesulfides, fluoropolymers, polyamides, polyesters, polycarbonates and mixtures thereof.

8. The polymeric composition according to claim 7, further comprising a micro-powder fluoropolymer having a melting temperature in the range of 150 to 400° C.

9. The polymeric composition of claim 7, further comprising at least one fibrous filler and one or more additional ingredient(s), selected from the group consisting of colorants, pigments, light stabilizers, heat stabilizers, antioxidants, acid scavengers, processing aids, nucleating agents, lubricants, flame retardants, smoke-suppressing agents, antistatic agents, anti-blocking agents, conductivity additives, plasticizers, flow modifiers, extenders, metal deactivators and mixtures thereof.

10. An article of manufacture comprising the polymeric composition of claim 7, wherein said article of manufacture is selected from the group consisting of a substrate, sheet, film, multilayer structure, multilayer sheet, multilayer film, molded part, extruded shape, molded shape, coated part, pellet, powder, foam, fiber, flaked fiber, and combinations thereof.

11. The article of claim 10, wherein the article has a multilayer structure comprising at least two layers wherein a first layer of the at least two layers comprises the polymeric composition of claim 7 and the second layer of the at least two layers comprises a conductive material; wherein said conductive material is selected from the group consisting of copper, silver, gold, nickel, titanium, and mixtures thereof.

12. The article of claim 10 wherein the article is a circuit board.

13. The polymeric composition according to claim 1, further comprising a filler selected from the group consisting of fibrous fillers and non-fibrous fillers.

14. The polymeric composition according to claim 13, wherein the weight percent filler ranges from 10 weight percent to 80 weight percent.

15. The polymeric composition according to claim 14, wherein said filler is selected from the group consisting of glass fiber, carbon fiber, carbon black, graphite, graphene, fluoropolymer, and mixtures thereof.

16. A composition comprising the polymeric composition of claim 1, and further comprising at least one fibrous filler and one or more additional ingredient(s), selected from the group consisting of colorants, pigments, light stabilizers, heat stabilizers, antioxidants, acid scavengers, processing aids, nucleating agents, lubricants, flame retardants, smoke-suppressing agents, anti-static agents, anti-blocking agents, conductivity additives, plasticizers, flow modifiers, extenders, metal deactivators and mixtures thereof.

17. An article of manufacture comprising the polymeric composition of claim 1, wherein said article of manufacture is selected from the group consisting of a substrate, sheet, film, multilayer structure, multilayer sheet, multilayer film, molded part, extruded shape, molded shape, coated part, pellet, powder, foam, fiber, flaked fiber, and combinations thereof.

18. The article of claim 17, wherein the article has a multilayer structure comprising at least two layers wherein a first layer of the at least two layers comprises the polymeric composition of claim 1 and the second layer of the at least two layers comprises a conductive material; wherein said conductive material is selected from the group consisting of copper, silver, gold, nickel, titanium, and mixtures thereof.

19. The article of claim 18, wherein the article is a circuit board.

20. A method of making a polymeric composition according to claim 1, comprising reacting 2H-benzimidazolone of formula IV:

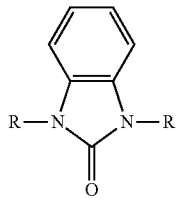

with a mixture of 4,4'-dihalobenzophenone of formula V:

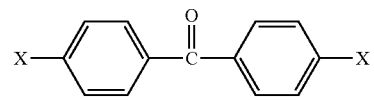

and/or 1,4-bis(4-halobenzoyl)benzene of formula VIa

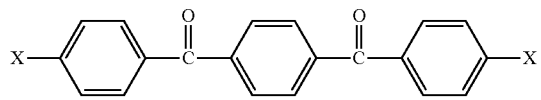

and/or 1,3-bis(4-halobenzoyl)benzene of formula, formula VIb

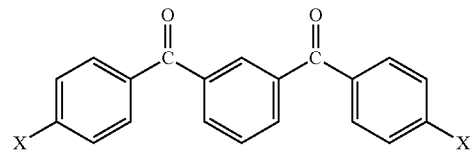

in a molar ratio (V):(VIa+VIb) of 99:1 to 0:100;

in an organic solvent in the presence of $K_2CO_3$ or a mixture of $Na_2CO_3$ and $K_2CO_3$ under atmospheric pressure or pressure at temperatures from 130 to 300° C., wherein R is selected from an alkali metal and a hydrogen atom, each X is selected from a chlorine and fluorine atom, and a molar ratio (VIa:VIb) of formula VIa and VIb is selected from 100:0 to 0:100 when the molar ratio (V):(VIa+VIb) is greater than 0:100, or a molar ratio (VIa:VIb) of formula VIa and VIb is selected from 99:1 to 1:99 when the molar ratio (V):(VIa+VIb) is 0:100.

* * * * *